(12) United States Patent
Rehmeyer et al.

(10) Patent No.: US 12,001,356 B2
(45) Date of Patent: Jun. 4, 2024

(54) DELAY ELEMENTS FOR COMMAND TIMING IN A MEMORY DEVICE

(71) Applicant: Micron Technology, Inc., Boise, ID (US)

(72) Inventors: James S. Rehmeyer, Boise, ID (US); Christopher G. Wieduwilt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/463,318

(22) Filed: Aug. 31, 2021

(65) Prior Publication Data

US 2023/0069576 A1 Mar. 2, 2023

(51) Int. Cl.
*G06F 13/16* (2006.01)
*G11C 17/14* (2006.01)
*G11C 17/16* (2006.01)
*G11C 17/18* (2006.01)

(52) U.S. Cl.
CPC ........ *G06F 13/1689* (2013.01); *G11C 17/143* (2013.01); *G11C 17/18* (2013.01)

(58) Field of Classification Search
CPC .... G06F 13/1689; G11C 17/143; G11C 17/18
USPC ........................................................ 710/107
See application file for complete search history.

(56) References Cited

U.S. PATENT DOCUMENTS

| | | | | |
|---|---|---|---|---|
| 5,917,760 | A * | 6/1999 | Millar | G11C 7/1072 365/194 |
| 2003/0145156 | A1* | 7/2003 | Khandekar | G11C 7/1066 711/104 |
| 2004/0120204 | A1* | 6/2004 | Kanda | G11C 16/20 365/194 |
| 2012/0020174 | A1* | 1/2012 | Kuramori | G11C 8/08 365/194 |
| 2014/0089574 | A1* | 3/2014 | Sohn | G11C 7/1063 711/105 |
| 2020/0168268 | A1* | 5/2020 | Bessho | G11C 11/4076 |
| 2020/0219555 | A1 | 7/2020 | Rehmeyer | |
| 2020/0388324 | A1 | 12/2020 | Rehmeyer | |
| 2021/0349730 | A1* | 11/2021 | Lee | G06F 9/4403 |

* cited by examiner

*Primary Examiner* — Chun Kuan Lee
(74) *Attorney, Agent, or Firm* — Brooks, Cameron & Huebsch, PLLC

(57) ABSTRACT

A timing of an execution of a command in a memory device can be affected delay elements. The delay elements of a unit of delay elements can cause variable delays of the command paths. The delay elements can be activated based on settings stored in a fuse array of a memory device. The delay elements can be used to change a timing of current draw of the memory devices.

21 Claims, 5 Drawing Sheets

DELAY ELEMENTS FOR COMMAND TIMING IN A MEMORY DEVICE

TECHNICAL FIELD

The present disclosure relates generally to memory devices, and more particularly, to apparatuses and methods related to modifying a timing of commands in a memory device using delay elements.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
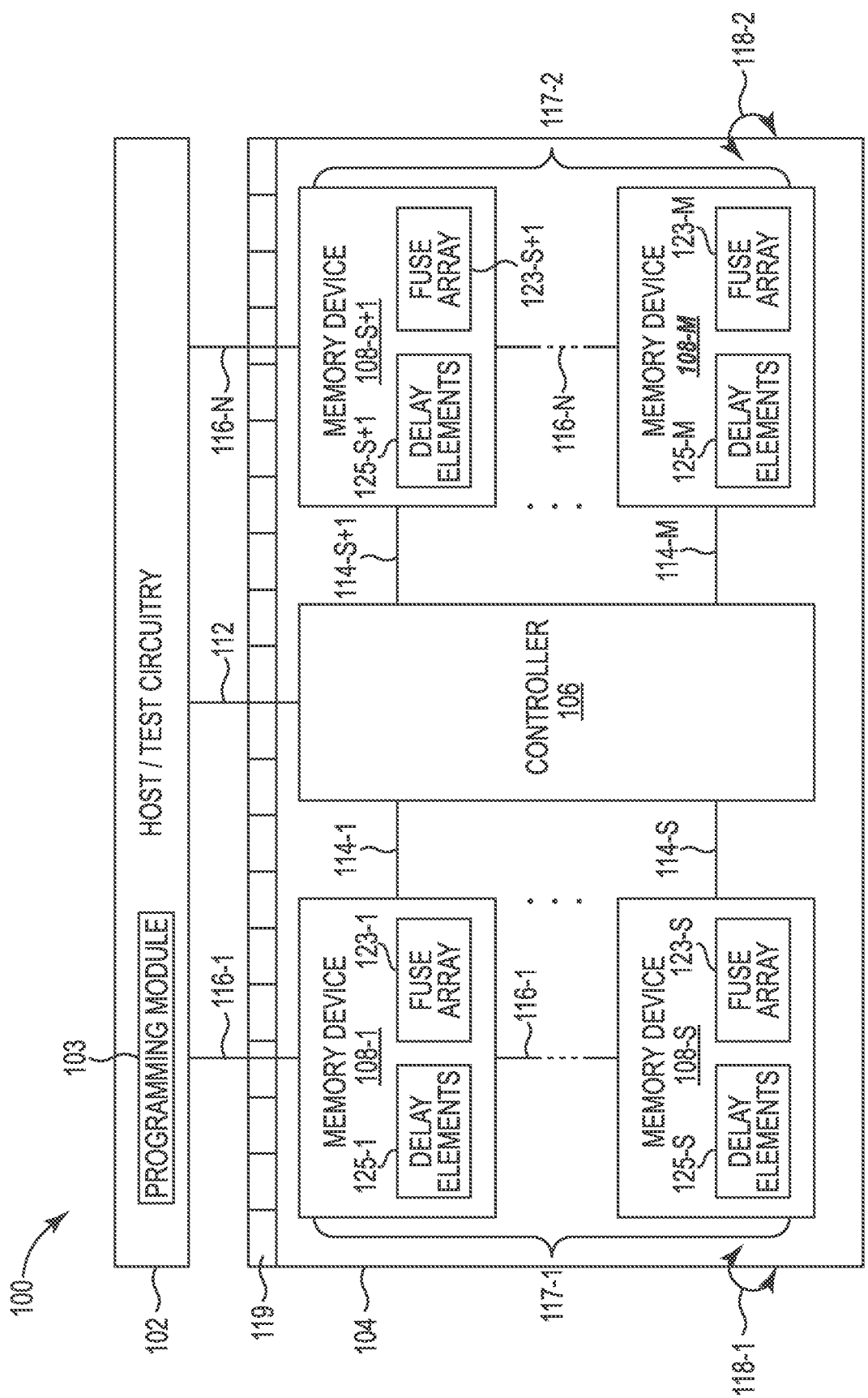
FIG. 1 is a block diagram of an apparatus in the form of a computing system including memory devices in accordance with a number of embodiments of the present disclosure.

The present disclosure includes apparatuses and methods related to modifying a timing of commands a memory device using delay elements. As used herein, modifying a timing of a command can refer to a timing of an execution of a command in a memory device as compared to a default timing of an execution of a command in a different memory device.

In various instances, a memory sub-system can include memory devices. Various memory devices can share a command path used to receive commands from a plurality of pins of the memory sub-system. However, each of the memory devices can include a different command path internal to each of the memory devices that is not shared with the other memory devices. The command paths internal to the memory devices can be used to modify a timing of execution, by the memory devices, of commands.

In previous approaches, a command received at each of the memory devices can be executed at, approximately, the same time. The execution of commands at relatively the same time across multiple memory devices can be referred to as an instantaneous execution of the commands across the memory devices. Instantaneously executing a command at a same time across multiple memory devices can cause a power spike in the multiple memory devices and/or the memory system. As used herein, a power spike can refer to a consumption of power across the multiple memory devices that is greater than a threshold.

The spike in power can strain a power delivery network of the memory system. For example, the power spike can strain a power delivery network corresponding to the memory devices that simultaneously execute a command (e.g., the commands each of which is executed at a corresponding memory device at relatively the same time). As used herein, a power delivery network can include components of the memory system that are utilized to deliver power to the memory devices.

A spike in power consumption of the memory devices of the memory system can cause interference within the memory cells of the memory devices and/or with the memory cells of neighboring memory devices. As used herein, "neighboring memory devices" means memory devices that are physically in close proximity. For example, neighboring devices can include memory devices that are physically adjacent one to another, memory devices in a rank of the memory system that are physically adjacent to a different rank of memory devices, and/or memory devices in a channel that are physically adjacent to a different channel of the memory system. The terms rank and channel are further described in FIG. 1. A spike in power consumption of the memory devices can also strain a power delivery network in its ability to provide power to meet the power needs of the memory devices during the spike in power consumption.

Aspects of the present disclosure address the above and other deficiencies. In various instances, the execution of a command by the memory devices can be distributed over time such that the command is not executed by each of the memory devices simultaneously. For example, a first memory device can execute the command at a first time and a second memory device can execute the command at a second time where the first time and the second time are separated by a threshold duration of time. Separating the execution of the command by the memory devices prevents a spike in power consumption caused by the concurrent execution of the command by the memory devices. Preventing the spike in power consumption can prevent interference between memory cells of different memory devices.

The execution of the command by the memory devices can be separated utilizing delay elements. Each memory device can include a different delay elements. The delay elements can cause corresponding command paths to have different delays and/or timings. As used herein, a "command path internal to the memory device" is a path that signals representing commands traverse. Delay elements can add or subtract from a default command path.

The figures herein follow a numbering convention in which the first digit or digits correspond to the drawing figure number and the remaining digits identify an element or component in the drawing. Similar elements or components between different figures may be identified by the use of similar digits. For example, 108-1 may reference element "08" in FIG. 1, and a similar element may be referenced as 208 in FIG. 2. Analogous elements within a Figure may be referenced with a hyphen and extra numeral or letter. See, for example, elements 123-1, 123-S in FIG. 1. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of an apparatus in the form of a computing system 100 including memory devices 108-1 to 108-S and memory devices 108-S+1 to 108-M in accordance with a number of embodiments of the present disclosure. The memory devices 108-1 to 108-S and the memory devices 108-S+1 to 108-M are referred to as memory devices 108. As used herein, the computing system 100, a host 102, a memory system 104, and/or the memory device 108, for example, might also be separately considered to be an "apparatus." In this example, the computing system 100 includes the host 102 coupled to the memory system 104 via an interface. The interface can pass control, address, data, and other signals between the memory system 104 and the host 102. The interface can include a command/address bus 112 and data buses 116-1, . . . , 116-N coupling the memory system 104 to the host 102 via the pins 119. In some embodiments, the command/address bus 112 can be comprised of separate command and address buses. In some embodiments, the command/address bus 112 and the data buses 116 can be part of a common bus. The command/address bus 112 can pass signals from the host 102 to the controller 106 such as clock signals for timing, reset signals, chip selects, addresses for the memory devices 108, parity information, etc. The command/address bus 112 can be used by the controller 106 to send alert signals to the host 102. The command/address bus 112 can be operated according to a protocol. The interface can be a physical interface employing a suitable protocol. Such a protocol may be custom or proprietary, or the interface may employ a standardized protocol, such as Peripheral Component Interconnect Express (PCIe), Gen-Z interconnect, cache coherent interconnect for accelerators (CCIX), etc. In some embodiments, the controller 106 is a serial presence detect (SPD) hub or simply "hub," which may include a temperature sensor, clock functionality, isolation circuitry (e.g., an ability to isolate a bus on the module, such as a bus or buses 114) from other buses or from the host 102, such as via bus 112 or buses 116). In some cases, the controller 106 is a register clock driver (RCD), such as RCD employed on an RDIMM or LRDIMM.

The bus 112 and the buses 116 can provide signals from the host 102 to the memory system 104 via the pins 119. The memory system 104 can include the pins 119. The memory system 104 may receive signals through the pins 119. For example, the memory system 104 can receive, via the buses 112, 116, commands, addresses, and/or data, among other signals, through the pins 119. As used herein, the pins 119 physically couples a memory system 104 to a computing system 100. The pins 119 of the memory system are a physical interface that enables communication between the memory system and the computing system 100. The interface coupling the memory system 104 and the host 102 can form a physical connection through metal connections. The pins 119 of the interface can be composed of metals such as copper, nickel, and/or gold, among other types of metals. The pins 119 can include top pins and bottom pins. The top pins and the bottom pins can include pins formed on either side of a circuit board and are not intended to limit the orientation of the pins on the memory system 104.

The computing system 100 can be a personal laptop computer, a desktop computer, a digital camera, a mobile telephone, a memory card reader, or an Internet-of-Things (IoT) enabled device, among various other types of systems. For clarity, the computing system 100 has been simplified to focus on features with particular relevance to the present disclosure. The host 102 can include a number of processing resources (e.g., one or more processors, microprocessors, or some other type of controlling circuitry) capable of accessing the memory system 104. In some embodiments, the host 102 can comprise test circuitry suitable for testing the memory system 104 and/or the memory devices 108 prior to deployment of the memory system 104 (e.g., prior to sale, shipping, or use of the memory system 104). One of ordinary skill in the art will be familiar with test circuitry that can be used to test memory systems 104.

The memory system 104 can provide main memory for the computing system 100 or could be used as additional memory or storage throughout the computing system 100. By way of example, the memory system 104 can be a dual in-line memory module (DIMM) including memory devices 108 operated as double data rate (DDR) DRAM, such as DDR5, a graphics DDR DRAM, such as GDDR6, or another type of memory system. Embodiments are not limited to a particular type of memory system 104. Other examples of memory devices 108 include RAM, ROM, SDRAM, PCRAM, RRAM, flash memory, and three-dimensional cross-point, among others. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. The memory devices 108-1 to 108-S are coupled to the first data bus 116-1. The memory devices 108-S+1 to 108-M are coupled to the second data bus 116-N. The data bus 116 can provide data for read/write operations between the host 102 and the memory system 104.

The memory system 104 can include a controller 106 coupled to the memory devices 108 via respective buses 114-1 to 114-S and buses 114-S+1 to 114-M. The buses 114-1 to 114-S and the buses 114-S+1 to 114-M can be referred to as buses 114. The buses 114 can be referred to as internal command/address buses 114 (e.g., internal to the memory system 104, as opposed to the command/address bus 112 between the host 102 and the memory system 104). In various examples, the physical connection (not shown) between the pins 119 and the memory devices 108, including the buses 114 can be referred to as shared buses 114. The buses 114-1 to 114-S can be a first shared command bus and the buses 114-S+1 to 114-M can be a second shared command bus.

The controller 106 can be implemented as hardware, firmware, and/or software. For example, the controller 106 can be an application specific integrated circuit (ASIC) coupled to a printed circuit board including a physical interface. The controller 106 can thereby relay command and/or address signals from the command/address bus 112 from the host 102 to the memory devices 108. In some embodiments, the controller 106 may perform command and/or address translation of the command and/or address signals from the host 102 before relaying the same to the memory devices 108. The controller 106 may operate the command/address buses 114 with a same or different protocol than that with which the command/address bus 112 is operated between the host 102 and the memory system 104. The controller 106 can use the buses 114 to send command and/or address signals, clock signals, select signals, and other related signals to the memory devices 108. For example, the controller 106 can use the buses 114 to send activate commands and precharge commands to the memory device 108. The memory devices 108 can use the buses 114 to send error signals, reset signals, and other related signals to the controller 106. The controller 106 thus provides access to the memory devices 108 for the host 102. Examples of the commands for the memory devices 108 include read, write, and erase commands for data on the memory devices 108, among other commands. The memory system 104 can include separate integrated circuits, or both the controller 106 and the memory devices 108 can be on the same integrated circuit.

The examples described herein can be applicable to commands that are high instantaneous current commands. High instantaneous current commands are commands that, when executed, cause a memory device to have a current draw that is high and instantaneous. A current draw can be high if it is greater than a threshold or greater than various other commands. The current draw can be instantaneous if the distribution of the current draw of the execution of a single command is within a time duration as compared to other commands. For example, a current draw can be instantaneous if the current draw extends over 1 ns. Activate commands and precharge commands are examples of high instantaneous current commands. As such, any examples provided in terms of activate commands and/or precharge commands can also be provided in terms of high instantaneous current commands.

Each of the memory devices 108 can include a fuse array (e.g., fuse arrays 123-1 to 123-S and fuse arrays 123-S+1 to 123-M). The fuse arrays 123-1 to 123-S and the fuse arrays 123-S+1 to 123-M can be referred to as fuse arrays 123. The memory devices 108 are each illustrated as including a different one of the fuse arrays 123. Each memory device 108 can be a separate memory die, which may also be referred to as a chip. The fuse arrays 123 can be utilized to store settings that can be utilized to change a timing of the execution of commands provided from the controller 106 to the memory devices 108.

As used herein, a fuse array is an array of programmable elements. A fuse array can include fuse elements. Examples of fuse elements include antifuse elements, and a fuse arrays can include a number of fuses and/or a number of antifuses.

Each of the memory devices 108 can include delay elements (e.g., delay elements 125-1 to 125-S and delay elements 125-S+1 to 125-M). The delay elements 125-1 to 125-S and the delay elements 125-S+1 to 125-M can be referred to as delay elements 125. The memory devices 108 are each illustrated as including a different one of the delay elements 125. The delay elements 125 can be utilized to change a timing of the execution of commands provided from the controller 106 to the memory devices 108. As used herein, delay elements are programmable elements. For example, the delay elements can be switches. Each delay element from the delay elements can be a distinct switch. The delay elements can be programmed to select a path that can be utilized to change a timing of an execution of a command.

The memory devices 108 can be organized into ranks 117-1, 117-2 and channels 118-1, 118-2. The ranks 117-1, 117-2 can be referred to as ranks 117, while the channels 118-1, 118-2 can be referred to as channels 118. As used herein, a rank (e.g., ranks 117) is a set of memory devices 108 connected to a same chip select which are therefore accessed simultaneously. The memory devices 108 in a rank can receive commands simultaneously from the controller 106. The rank 117-1 can include the memory devices 108-1 to 108-S. The rank 117-2 can comprise memory devices 108-S+1 to 108-M. Each of the memory devices 108 in a rank can share a command path from the controller 106 to the memory devices 108. For example, the memory devices 108-1 to 108-S can share a command path while the memory devices 108-S+1 to 108-M share a different command path.

The channels 118 can comprise the ranks 117. For example, the channel 118-1 can comprise the rank 117-1 and a different rank (not shown) implemented on the opposite side of the rank 117-1 on the circuit board. The channel 118-2 can comprise the rank 117-2 and a different rank (not shown) implemented on the opposite side of the rank 117-2 on the circuit board.

The host 102 can comprise a programming module 103. The programming module 103 can be used to, for example, program the delay elements 125. The programming module 103 can read the setting stored in fuse array 123 and can broadcast the setting to the delay elements 125 to program the delay elements 125. In various instances, the fuse arrays 123 can be programmed by a manufacturer of the memory system 104 prior to a deployment and/or a sale of the memory system 104 and/or the computing system 100 to store the setting in the fuse arrays 123.

The fuse arrays 123 can array including a plurality of fuses and/or anti-fuses, an array of flash memory cells, an array of phase change memory cells, or a combination thereof. The fuse arrays 123 can be coupled with the controller 106 and/or the programming module 103 which can be configured to retrieve the settings from the fuse arrays 123. Further, the controller 106 and/or the programming module 103 can be configured to transmit the settings to one or more delay elements 125 of the memory devices 108 (e.g., during initialization procedures, power-up procedures). In some embodiments, the controller 106 and/or the programming module 103 can include a fuse logic configured to access (e.g., program/write, read) the fuse arrays 123. Further, the controller 106 and/or the programming module 103 can include a broadcast logic configured to send out (e.g., transmit, broadcast, disseminate) the information retrieved from the fuse arrays 123 to the delay elements 125.

The information stored in fuse arrays 123 can be broadcast (e.g., serially) throughout the die (e.g., on power-up) and aspects of the die may be operated according to the operating information. Broadcasting fuse data can include passing a fuse token from one memory section to another and writing relevant information to latches in a memory section where the fuse token is active.

Figure 2:
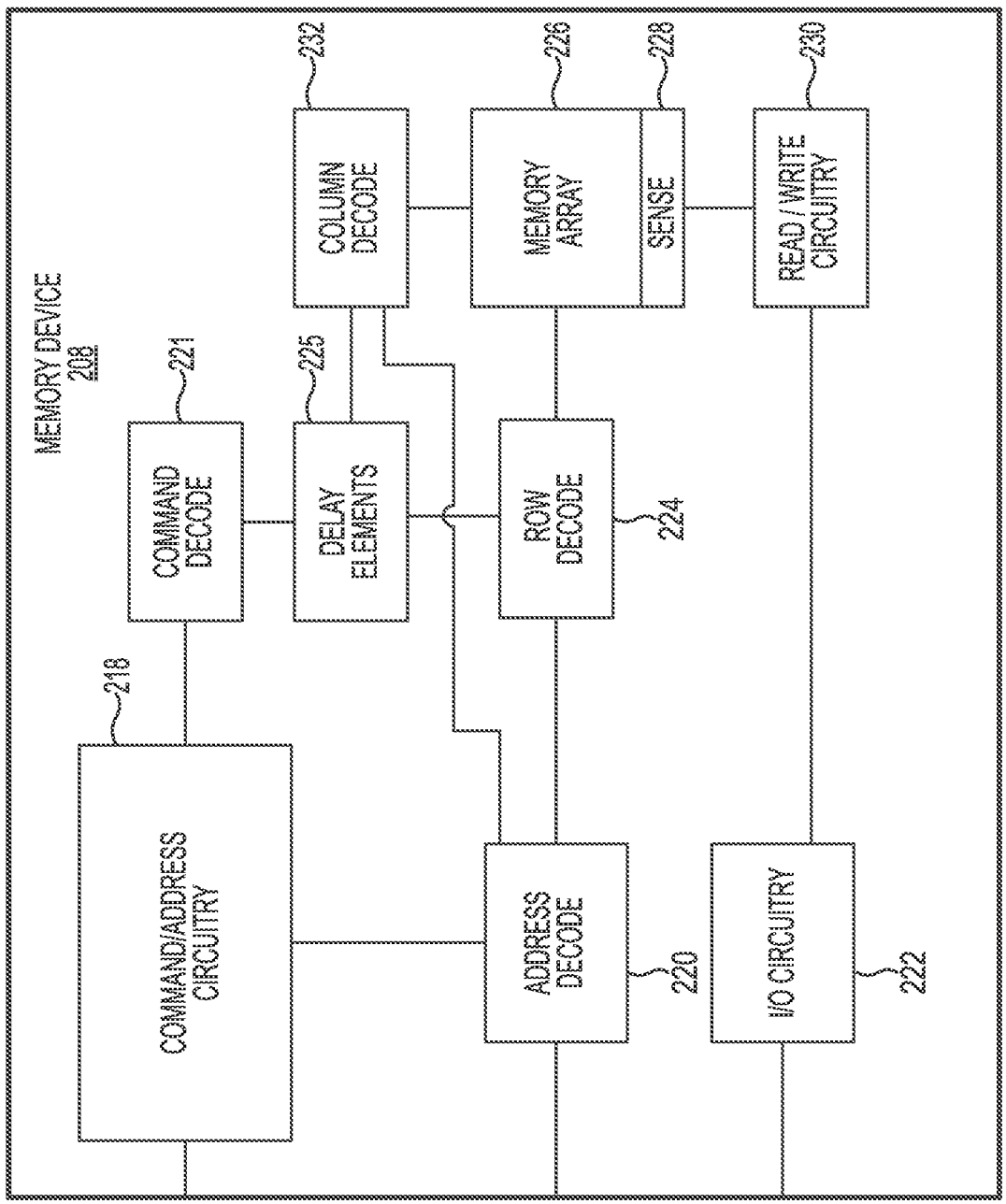
FIG. 2 is a block diagram of an apparatus in the form of a memory device comprising delay elements in accordance with a number of embodiments of the present disclosure.

FIG. 2 is a block diagram of an apparatus in the form of a memory device 208 comprising delay elements 225 in accordance with a number of embodiments of the present disclosure. The memory device 208 includes command/address circuitry 218, a command decoder 221, delay elements 225, a column decoder 232, and a row decoder. The memory device 208 can also include address decoder 220, a memory array 226, sensing circuitry 228, I/O circuitry 222, and read/write circuitry 230.

The memory device 208 is analogous to any of the memory devices 108 illustrated in FIG. 1. The command/address circuitry 218 provides signals to an address decoder 220 and/or a command decoder 221. The signals provided to the command decoder 221 can be commands provided by the command/address circuitry 218 that may have originated with a host and/or test circuitry (not specifically illustrated). These signals can include chip enable signals, write enable signals, address latch signals, precharge signals, and/or activate signals, among others, that are used to control operations performed on the memory array 226. Such operations can include data read operations, data write operations, data erase operations, data move operations, precharge operations, activate operations, etc. In various embodiments, the command/address circuitry 218 is responsible for executing instructions from the controller. The command/address circuitry 218 can comprise a state machine, a sequencer, and/or some other type of control circuitry, which may be implemented in the form of hardware, firmware, or software, or any combination of the three.

Data can be provided to and/or from the memory array 226 via data lines coupling the memory array 226 to an I/O circuitry 222 via read/write circuitry 230. The I/O circuitry 222 can be used for bi-directional data communication with the host and/or test circuitry over an interface. The read/write circuitry 230 is used to write data to the memory array 226 or read data from the memory array 226. As an example, the read/write circuitry 230 can comprise various drivers, latch circuitry, etc. In some embodiments, the data path can bypass the command/address circuitry 218.

The command/address circuitry 218 can latch address signals provided over an interface. Address signals are received and decoded by the address decoder 220 utilizing a row decoder 224 and a column decoder 232 to access the memory array 226. Data can be read from memory array 226 by sensing voltage and/or current changes on the sense lines using sensing circuitry 228. The sensing circuitry 228 can be coupled to the memory array 226. Each memory array 226 and corresponding sensing circuitry 228 can constitute a bank of the memory device 208. The sensing circuitry 228 can comprise, for example, sense amplifiers that can read and latch a page (e.g., row) of data from the memory array 226.

The memory array 226 can comprise memory cells arranged in rows coupled by access lines (which may be referred to herein as word lines or select lines) and columns coupled by sense lines (which may be referred to herein as digit lines or data lines). Although the memory array 226 is shown as a single memory array, the memory array 226 can represent the memory array arraigned in banks of the memory device 208. The memory array 226 can include a number of memory cells, such as volatile memory cells (e.g., DRAM memory cells, among other types of volatile memory cells) and/or non-volatile memory cells (e.g., RRAM memory cells, among other types of non-volatile memory cells).

The command/address circuitry 218 can provide commands to the command decoder 221. The command decoder 221 can decode signals representing commands such as activate commands and precharge commands. The delay elements 225 can receive the decoded signals (e.g., decoded commands) from the command decoder 221. Individual delay elements can shorten or lengthen a default timing of a command path internal to the memory device 208.

As used herein, a command path can include a physical connection used to provide signals to the memory array 226, where the signals represent commands. The command path can include a path internal to the command/address circuitry 218, a path from the command/address circuitry 218 to the command decoder 221, a path internal to the command decoder 221, a path from the command decoder 221 to the delay elements 225, a path internal to the delay elements 225, and/or a path from the delay elements 225 to the row decoder 224 and/or the column array 232. The command path can be a metal connection, among other types of physical connections that can be used to deliver/receive signals representing commands. The delay elements 225 are further described in FIG. 3.

The row decoder 224 and the column decoder 232 can receive signals from the delay elements 225. The memory array 226 and/or the sensing circuitry 228 can receive the signals from the row decoder 224 and/or the column decoder 232. The signals can cause, for example, rows and/or columns of the memory array 226 to be activated and/or precharged. The signals can cause memory cells commonly coupled to a select line and/or a sense line to be activated and/or precharged or can cause the select lines and/or sense lines to be activated and/or precharged. The activation and/or the precharging of the memory cells commonly coupled to a select line and/or a sense line can be referred to as the execution of the activation command and/or the execution of the precharge command.

Although the delay elements 225 are shown as being separate from the command decoder 221 and/or the command/address circuitry 218, the delay elements 225 can be integrated with the command decoder 221 and/or the command/address circuitry 218. The delay elements 225 can also be implemented between the row decoder 224 and the memory array 226 and/or he column decoder 232 and the memory array 226.

Figure 3:
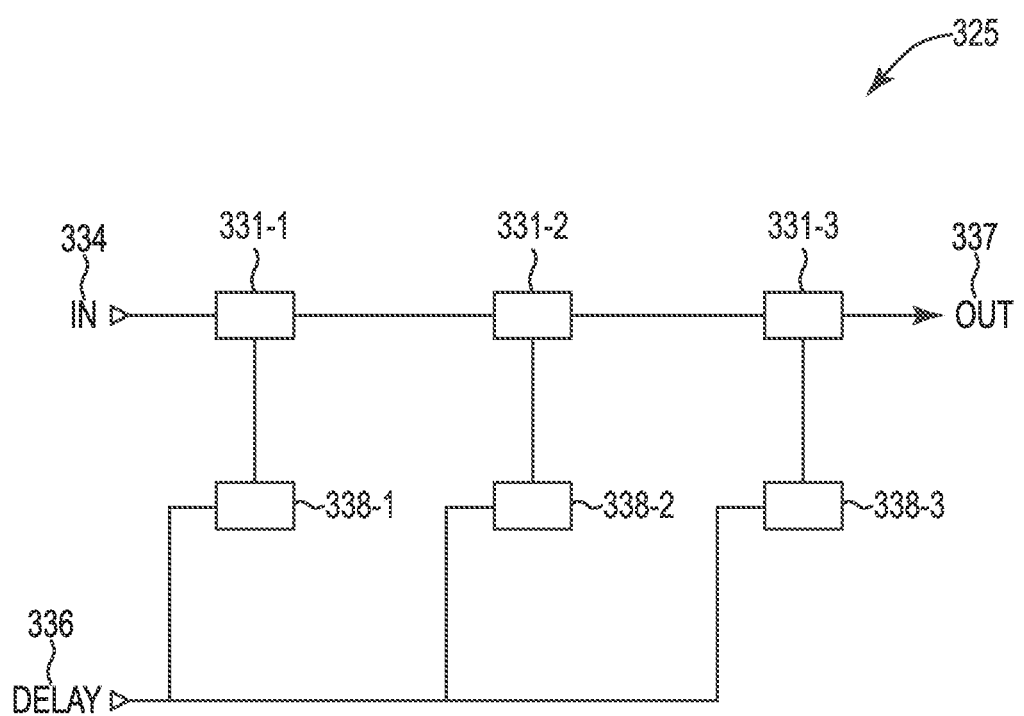
FIG. 3 is an example of a delay path in accordance with a number of embodiments of the present disclosure.

FIG. 3 is an example of a delay path 325 in accordance with a number of embodiments of the present disclosure. The delay path 325 includes an input 334 and an output 337. The input and output can be on any portion of a command path. Between the input and output are three delay blocks 331-1, 331-2, 331-3. The delay blocks 331-1, 331-2, 331-3 can also be referred to as delay elements 331-1, 331-2, 331-3. The delay path 325 also includes a delay trim input 336. The delay trim input 336 represents the latched fuse states, which are used to select an amount of delay in the command path. The delay trim input 336 can select or activate any combination of the delay blocks 331 via the selector blocks 338-1, 338-2, 338-3. The delay trim input 336 is illustrated as being connected to three different delay selector blocks 338-1, 338-2, 338-3, any combination of which can be selected with the delay trim input 336 to vary the total delay applied between the input 334 and the output 337. As illustrated, eight different individual delays are selectable with the three different delay states implemented using the selector blocks 338-1, 338-2, 338-3. Embodiments are not limited to three delay states as other quantities of delay states are possible.

By way of example, the delay blocks 331 can represent inverters added in series to delay a signal, however embodiments are not limited to this example. The delay blocks 331 can also represent programmable capacitors and/or programmable gates to delay a signal. The delay trim input 336 can activate the selector blocks 338, which can be multiplexed with the delay blocks 331 to effectively create an addressable or selectable variable delay path between the input 334 and the output 337.

The delay blocks 331 can be programmed utilizing setting stored in an array of fuses. The array of fuses can be programmed with setting prior to deployment of a corresponding memory system. The array of fuses can be programed by a provider of the corresponding memory system. The array of fuses can be programmed by a host and/or a testing circuitry. For instance, the array of fuses can be programmed by programming module 103 of FIG. 1. The settings read from the array of fuses can be broadcast via the delay trim input 336 to program the delay blocks 331 utilizing the selector blocks 338-1, 338-2, 338-3.

Programing the delay blocks 331 can include setting the delay blocks 331 to a non-default state or setting the delay blocks 331 to a default state. The delay blocks 331 can be set to a default state by refraining from setting the delay blocks 331 to a non-default state.

Leaving the delay blocks 331 in a default state can cause a corresponding delay path 325 which can be referred to as a default delay of the path. Setting the delay blocks 331 to a set state can cause the different delays to be utilized for the path 325 utilized for signals representing commands. A default delay path 325 can have a default delay to which other delays can be added to by activating the delay blocks 331-1, 331-2, 331-3. Although FIG. 3 shows three delay blocks 331, more or less than the three delay blocks 331 can be programmed to modify the delay of the delay path 325.

Figure 4:
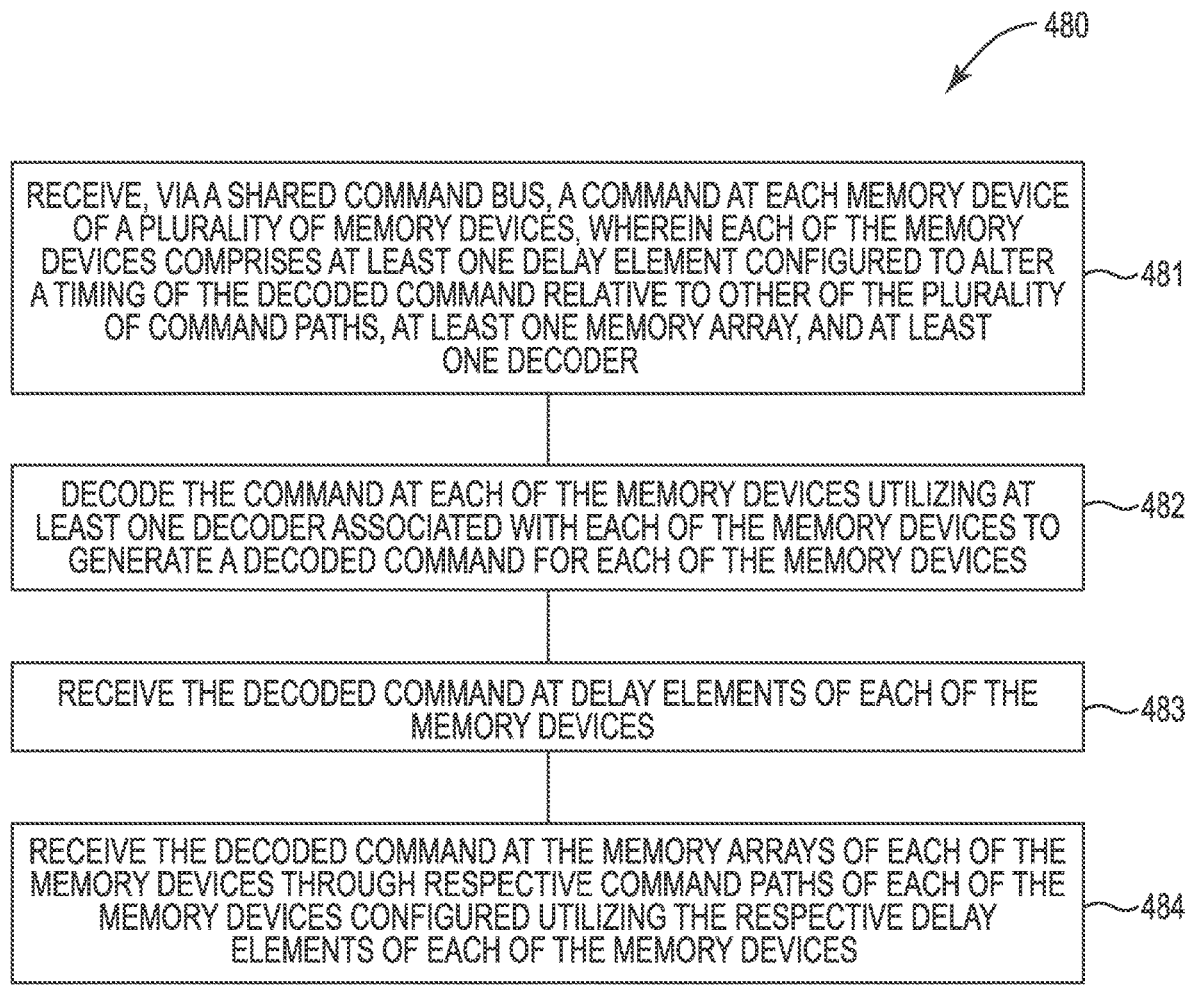
FIG. 4 illustrates an example flow diagram of a method for modifying a timing of commands using delay elements in accordance with a number of embodiments of the present disclosure.

FIG. 4 illustrates an example flow diagram of a method 480 for modifying a timing of commands using delay elements in accordance with a number of embodiments of the present disclosure. The method 480 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 480 is performed by a memory device 108 and/or by the host 102 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 481, a command can be received, via a shared command bus, at each memory device of a plurality of memory devices, wherein each of the memory devices comprises at least one delay element configured to alter a timing of the decoded command relative to other of the plurality of command paths, at least one memory array, and/or at least one decoder. Each of a quantity of the delay elements can receive signals from a corresponding one of the plurality of decoders. Each of the quantity of delay elements can be the same as each of the other quantity of delay elements. Each quantity of delay elements can comprise a same number of delay elements in a same configuration. The "configuration of the units of delay elements" refers to the manner in which the delay elements are coupled to each other and to selector blocks before being programmed or after being programmed. Each of the delay elements can have a same configuration prior to being programmed.

At block 482, the command can be decoded at each of the memory devices utilizing at least one decoder associated with each of the memory devices to generate a decoded command for each of the memory devices, At block 483, the decoded command can be received at delay elements of each of the memory devices. The decoded command can be received from a decoder. The command can be, for example, an activate command and/or a precharge command.

At block 484, the decoded command can be received at the memory arrays of each of the memory devices through respective command paths of each of the memory devices configured utilizing the respective delay elements of each of the memory devices. The delay elements can alter a timing of the decoded command relative to other of the plurality of command paths. The delay elements can be utilized to select a delay for a command path through which the decoded commands are provided to the memory arrays. Each memory device can have a single command path through which commands are executed. The timing of the command path can be configured utilizing the delay elements. For example, any given delay element can be configured to retain the default timing of the command path or to increment a delay or decrement a delay of the command path.

The "timing of the decoded command" refers to a timing of the execution of the decoded command. Although a command and/or a decoded command is described herein as a single signal, the command and/or the decoded command can comprise a plurality of signals. The timing of a decoded command can also refer to a timing of one or more signals corresponding to the command and/or the decoded command. A "timing of the decoded command" can describe a timing of one or more signals used to execute an activate operation and/or a precharge operation corresponding to a command and/or a decoded command.

Each of the plurality of memory devices can receive the command via a shared command bus. Each of the memory devices can receive commands from a controller of the memory sub-system through a shared command bus. The shared command bus can be utilized to provide a same command to each of the memory devices coupled to the shared command bus at a same time.

The decoded command can be received at the memory arrays through the plurality of command paths, where each of the plurality of memory devices comprises a different command path from the plurality of command paths. The command paths of each of the memory devices can be different based on a timing of the command paths. No two memory devices that share a command bus, to receive commands, can have a command path that has a same timing. A timing of a command path can describe a timing of the execution of the decoded command via the command path. Each of the command paths corresponding to different memory devices can have a different timing as compared to other command paths.

In various instances, a timing of each of the plurality of command paths is different based on a programming of the delay elements. The programming of the delay elements can include the setting (e.g., set state) of the delay elements or the refraining from setting the delay elements such that the delay elements remain in a default state. A timing of each of the plurality of command paths can be different based on an activation of selector blocks coupled to the delay elements. The states of the delay elements can be set using the selector blocks. The selector blocks can be programmed using the data stored in the fuse array. A delivery of the decoded command to plurality of memory devices can be delayed based on a delay introduced via the delay elements.

A timing of an execution of the decoded command can be distributed at each of the plurality of memory devices based on the programming of the delay elements. Each execution of the command can initiate at a different time. The distribution of the execution of the command can be an equal distribution such that no two commands are executed at a same.

A current draw of the execution of the decoded command at each of the plurality of memory devices can be distributed based on the programming of the delay elements. A current draw can describe a usage of power of the memory device to execute the decoded command. The current can be provided to the memory device via a power delivery network.

In various examples, two commands or more can be executed in different memory devices at a same time wherein the timing of the execution of the two commands is delayed as compared to a default timing of the execution of other commands in other memory devices. The delay elements of the different memory devices that execute commands at a same time can be configured similarly such that the command paths of the memory devices have a same delay which is different than the delay of the command paths of other memory devices that share a command bus.

In various instances, delay elements can receive the decoded command. The command can be received from a decoder. The delay elements can alter a timing of an implementation of the decoded command at the array as compared to different timings of an implementation of the decoded command by different apparatuses that share a command bus. As used herein, a decoded command can be implemented using signals to perform operations consistent with the decoded command. The decoded command can be precharge commands and/or activate commands, among others. The decoded command can comprise at least one of an activate command and a precharge command for the array.

Each of the delay elements can be in a default state which provides for a default timing of the implementation of the decoded command. In various examples, only one of the memory devices comprises delay elements in a default state. The delay elements can be configured to delay the timing of the decoded command based on the programming of the delay elements as compared to the different timings of the implementation of the decoded commands by the different apparatuses. The timing of the decoded command implemented in a memory device is provided in relation to the timing of the implementation of the decoded commands in different memory devices.

The shared command bus can be shared between the memory devices in a same rank of the memory system. The memory devices of a same rank of the memory system can share a plurality of pins of an interface of the memory system. The plurality of pins can be coupled to the shared command bus.

In various examples, a programming module of a host can be used to program the delay elements of the memory devices of a memory system based on settings read from an array of fuses. The programming module can receive and/or read an execution order corresponding to the plurality of memory device of the memory system. Each of the plurality of memory devices can comprise delay elements and a memory array. Each of the plurality of memory devices can share a command bus from the memory system. Responsive to receipt of the execution order, the delay elements can be programmed differently such that a command path internal to the plurality of memory devices has a different delay for each of the memory devices.

The command path internal to the plurality of memory devices can distribute the command to a corresponding bank of a corresponding memory array. Each of the plurality of memory devices can correspond to a same rank of the memory subsystem.

The configuration of the delay elements of the memory devices can include a quantity of delay elements and how the delay elements are coupled. For example, a configuration of the delay elements can include an activation of the delay elements. The programming module can program the delay elements differently by setting a different combination of the delay elements to generate the different delay of the command path for each of the memory devices.

Figure 5:
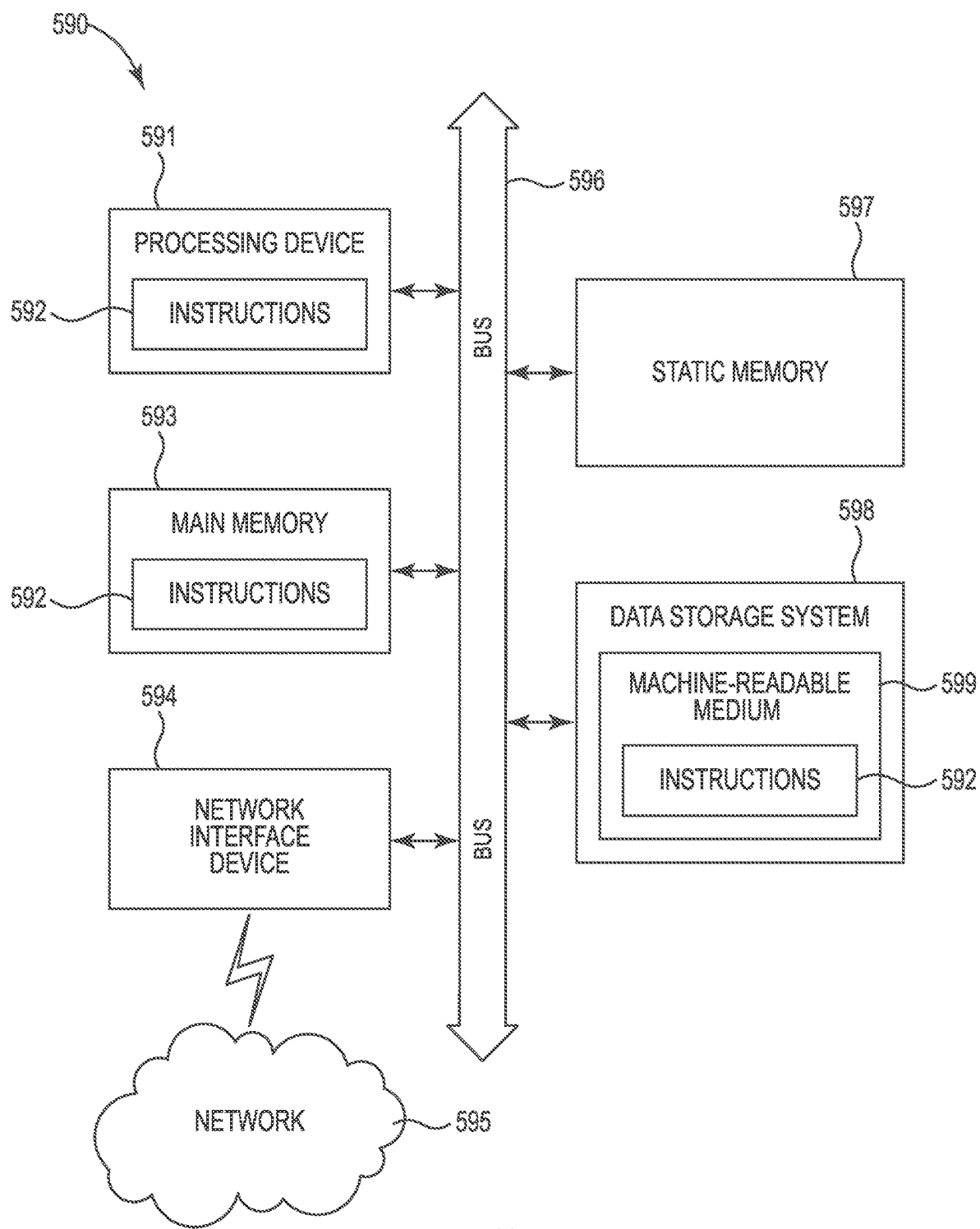
FIG. 5 illustrates an example of a computer system within which a set of instructions, for causing the machine to perform various methodologies discussed herein, can be executed.

FIG. 5 illustrates an example of a computer system 590 within which a set of instructions, for causing the machine to perform various methodologies discussed herein, can be executed. In various embodiments, the computer system 590 can correspond to a system (e.g., the computing system 100 of FIG. 1) that includes, is coupled to, or utilizes a memory system (e.g., the memory system 104 of FIG. 1) or can be used to perform the operations of a controller (e.g., the command/address circuitry 218 of FIG. 2). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 590 includes a processing device 591, a main memory 593 (e.g., read-only memory (ROM), flash memory, dynamic random access memory (DRAM) such as synchronous DRAM (SDRAM) or Rambus DRAM (RDRAM), etc.), a static memory 597 (e.g., flash memory, static random access memory (SRAM), etc.), and a data storage system 598, which communicate with each other via a bus 596.

Processing device 591 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 591 can also be one or more special-purpose processing devices such as an application specific integrated circuit (ASIC), a field programmable gate array (FPGA), a digital signal processor (DSP), network processor, or the like. The processing device 591 is configured to execute instructions 592 for performing the operations and steps discussed herein. The computer system 590 can further include a network interface device 594 to communicate over the network 595.

The data storage system 598 can include a machine-readable storage medium 599 (also known as a computer-readable medium) on which is stored one or more sets of instructions 592 or software embodying any one or more of the methodologies or functions described herein. The instructions 592 can also reside, completely or at least partially, within the main memory 593 and/or within the processing device 591 during execution thereof by the computer system 590, the main memory 593 and the processing device 591 also constituting machine-readable storage media.

In one embodiment, the instructions 592 include instructions to implement functionality corresponding to the host 102 and/or the memory devices 108 of FIG. 1. While the machine-readable storage medium 599 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving, via a shared command bus, a command at each memory device of a plurality of memory devices, wherein each of the memory devices comprises:
      at least one delay element configured to alter a timing of a decoded command relative to other of a plurality of command paths corresponding to the plurality of memory devices,
         wherein each of the memory devices comprises a different at least one delay element,
      at least one memory array, and
      at least one decoder;
   decoding the command at each of the memory devices utilizing at least one decoder associated with each of the memory devices to generate the decoded command for each of the memory devices;
   receiving the decoded command at delay elements of each of the memory devices,
      wherein the delay elements of each of the memory devices receives a different instance of the decoded command,
      wherein the delay elements are implemented as part of the at least one decoder associated with each of the memory devices, and
      wherein each of the delay elements are programmed with different timing delays utilizing a different array of fuses of each of the memory devices; and
   receiving the decoded command at the memory arrays of each of the memory devices through respective command paths of each of the memory devices configured to have the different timing delays relative to the memory devices utilizing the respective delay elements of each of the memory devices, and
      wherein the different timing delays are provided by a programming module external to the memory devices based on settings read from the different arrays of fuses.

2. The method of claim 1, further comprising receiving the decoded command at the plurality of memory arrays through the command paths, wherein each of the memory devices comprises a different command path from the command paths.

3. The method of claim 2, wherein a timing of each of the command paths is different based on a programming of the delay elements.

4. The method of claim 3, wherein the timing of the command paths is different based on an activation of selector blocks coupled to the delay elements.

5. The method of claim 4, further comprising delaying delivery of the decoded command to the memory devices based on a delay introduced via the delay elements.

6. The method of claim 4, further comprising distributing a timing of an execution of the decoded command at the memory devices based on the programming of the delay elements.

7. The method of claim 6, further comprising distributing a current draw of the execution of the decoded command at each of the memory devices based on the programming of the delay elements.

8. An apparatus, comprising:
an array of fuses;
an array of memory cells;
delay elements implemented in a command/address circuitry;
decoder coupled to the array of memory cells and the delay elements, wherein the decoder is configured to decode a command to generate a decoded command comprising at least one of an activate command and a precharge command for the array;
wherein each of the delay elements are configured to:
receive the command; and
alter a timing of an implementation of the decoded command at the array as compared to different timings of an implementation of the decoded command by different apparatuses that share a command bus,
wherein each of the delay elements receives a different instance of the command and provides the different instance of the command, and
wherein the delay elements are programmed using the array of fuses; and
wherein a timing delay of the implementation of the decoded command is provided by a programming module external to the apparatus based on settings read from the arrays of fuses.

9. The apparatus of claim 8, wherein each of the delay elements are in a default state which provides for a default timing of the implementation of the decoded command.

10. The apparatus of claim 9, wherein the delay elements are further configured to delay the timing of the decoded command based on the programming of the delay elements as compared to the different timings of the implementation of the decoded commands by the different apparatuses.

11. The apparatus of claim 9, wherein the delay elements are further configured to expedite the timing of the decoded command based on the programming of the delay elements as compared to the different timings of the implementation of the decoded commands by the different apparatuses.

12. The apparatus of claim 8, wherein the command bus is shared between the apparatus and the different apparatuses in a same rank of a memory system.

13. The apparatus of claim 12, further comprising a plurality of pins of the memory system that are coupled to the command bus and are shared between the apparatus and the different apparatuses in the same rank of the memory subsystem.

14. The apparatus of claim 8, wherein the delay elements are programmed by a provider of the apparatus.

15. An apparatus, comprising:
a programming module configured to:
receive an execution order corresponding to a plurality of memory devices of a memory system, wherein each of the memory devices comprises a different delay element and a memory array and wherein each of the memory devices shares a command bus from the memory system, wherein the execution order is read from the different arrays of fuses of the memory devices, and
responsive to receipt of the execution order, program each of the different delay elements implemented in command decoders of the plurality of memory devices, differently such that a command path internal to the memory devices has a different delay for each of the memory devices, and
wherein each of the different delay elements receives a different instance of a decoded command and provides the different instance of the decoded command to a corresponding memory array,
wherein each of the different delay elements are programmed using the different arrays of fuses of the memory devices, and
wherein the programming module is external to the memory system.

16. The apparatus of claim 15, wherein the command path internal to the memory devices distributes the command to a corresponding bank of a corresponding memory array.

17. The apparatus of claim 15, wherein each of the memory devices belongs to a rank of the memory system.

18. The apparatus of claim 15, wherein each respective unit of delay elements comprises a same quantity of delay elements.

19. The apparatus of claim 18, wherein each of the memory devices comprises a same quantity of delay elements from the delay elements each respective quantity of delay elements comprises a same configuration of the delay elements.

20. The apparatus of claim 19, wherein the same configuration includes a same activation of delay elements.

21. The apparatus of claim 15, wherein programming module is further configured to program the delay elements differently by setting a different combination of the delay elements to generate the different delay of the command path for each of the memory devices.

* * * * *